United States Patent
Liu et al.

(10) Patent No.: US 10,715,359 B1
(45) Date of Patent: Jul. 14, 2020

(54) DECISION FEEDBACK EQUALIZER

(71) Applicant: Realtek Semiconductor Corp., HsinChu (TW)

(72) Inventors: Hsi-En Liu, Kaohsiung (TW); Shawn Min, Hsinchu County (TW); Yi-Chun Hsieh, Miaoli County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/802,574

(22) Filed: Feb. 27, 2020

(30) Foreign Application Priority Data

Mar. 13, 2019 (TW) .............................. 108108453 A

(51) Int. Cl.
*H04L 25/03* (2006.01)
*H03F 3/45* (2006.01)
*H03K 3/037* (2006.01)

(52) U.S. Cl.
CPC ... *H04L 25/03057* (2013.01); *H03F 3/45475* (2013.01); *H03K 3/037* (2013.01)

(58) Field of Classification Search
CPC ..... H04L 2025/03369; H04L 25/03057; H04L 25/03063; H03F 3/45475; H03K 3/012; H03K 3/037; H03L 7/0802; H03L 7/0814; H03L 7/089; H03L 7/091
See application file for complete search history.

(56) References Cited

U.S. PATENT DOCUMENTS

| | | |
|---|---|---|
| 7,869,498 B2 | 1/2011 | Zeng et al. |
| 8,477,833 B2 | 7/2013 | Bulzacchelli et al. |
| 9,577,848 B1* | 2/2017 | Chattopadhyay ........ H04B 1/16 |
| 9,787,505 B2* | 10/2017 | Lim ................... H04L 25/03057 |
| 2012/0063242 A1* | 3/2012 | Kim ..................... G11C 7/1048 365/189.05 |
| 2013/0101011 A1* | 4/2013 | Shin ........................ H04B 1/16 375/233 |
| 2014/0177693 A1* | 6/2014 | Zhong ..................... H04L 7/033 375/226 |
| 2015/0103875 A1* | 4/2015 | Thakkar ............ H04L 25/03057 375/233 |

(Continued)

OTHER PUBLICATIONS

Vishnu Balan ,"A 15-22 Gbps Serial Link in 28 nm CMOS With Direct DFE", IEEE Journal of Solid-State Circuits, vol. 49, No. 12, Dec. 2014 ,2014.

(Continued)

*Primary Examiner* — Khanh C Tran

(74) *Attorney, Agent, or Firm* — Winston Hsu

(57) ABSTRACT

The present invention provides a decision feedback equalizer including a first path and a second path. The first path includes a first sampling circuit and a first latch circuit, wherein the first sampling circuit generates a first set signal and a first reset signal according to an input signal, a second set signal and a second reset signal, and the first latch circuit generates a first digital signal according to the first set signal and the first reset signal. The second path includes a second sampling circuit and a second latch circuit, wherein the second sampling circuit generates the second set signal and the second reset signal according to the input signal, the first set signal and the first reset signal, and the second latch circuit generates a second digital signal according to the second set signal and the second reset signal.

10 Claims, 7 Drawing Sheets

(56) References Cited

U.S. PATENT DOCUMENTS

| | | | |
|---|---|---|---|
| 2015/0256362 A1* | 9/2015 | Ganzerli | H04L 25/03057 375/233 |
| 2016/0080178 A1* | 3/2016 | Chen | H03L 7/091 375/233 |
| 2019/0066764 A1* | 2/2019 | Spirkl | G11C 11/4096 |

OTHER PUBLICATIONS

Seuk Son, "A 2.3-mW, 5-Gb/s Decision-Feedback Equalizing Receiver Front-End with Static-Power-Free Signal Summation and CDR-based Precursor ISI Reduction", IEEE ASSCC 2012, 2012.

* cited by examiner

DECISION FEEDBACK EQUALIZER

BACKGROUND OF THE INVENTION

1. Field of the Invention

The present invention relates to a decision feedback equalizer.

2. Description of the Prior Art

A decision feedback equalizer (DFE) is a technique often used at the receiving end of a high-speed cable transmission system to compensate channel loss or channel reflection of the transmission signals, and the main principle of operation is to eliminate an inter-symbol interference (ISI) of the next data according to the received digital signal and tap coefficients obtained by using an adaptive algorithm. In the analog circuit of the high-speed decision feedback equalizer, the most difficult part to achieve is the feedback of the first tap, because in principle, the feedback signal is delayed by a sample, a feedback path and a summer and must be prepared before the next data, especially the timing constraints become troublesome at higher speed.

In order to solve this problem, some patented technologies (for example, U.S. Pat. Nos. 7,586,498 and 8,847,833) and papers have proposed related decision feedback equalizers. However, these techniques have temperature drift problems in the design of tap coefficients, and the tap coefficients must be adjusted depending on the background calibration, thus increasing the instability and complexity of the circuit.

SUMMARY OF THE INVENTION

It is therefore an objective of the present invention to provide a decision feedback equalizer having advantages of high speed, low temperature effect, low power consumption, and no background calibration for adjusting tap coefficients, to solve the above-mentioned problems.

In one embodiment of the present invention, a decision feedback equalizer comprising a first path and a second path is disclosed. The first path comprises a first sampling circuit and a first latch circuit, wherein the first sampling circuit is arranged to generate a first set signal and a first reset signal according to an input signal, a second set signal and a second reset signal, and the first latch circuit is arranged to generate a first digital signal according to the first set signal and the first reset signal. The second path comprises a second sampling circuit and a second latch circuit, wherein the second sampling circuit is arranged to generate the second set signal and the second reset signal according to the input signal, the first set signal and the first reset signal, and the second latch circuit is arranged to generate a second digital signal according to the second set signal and the second reset signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
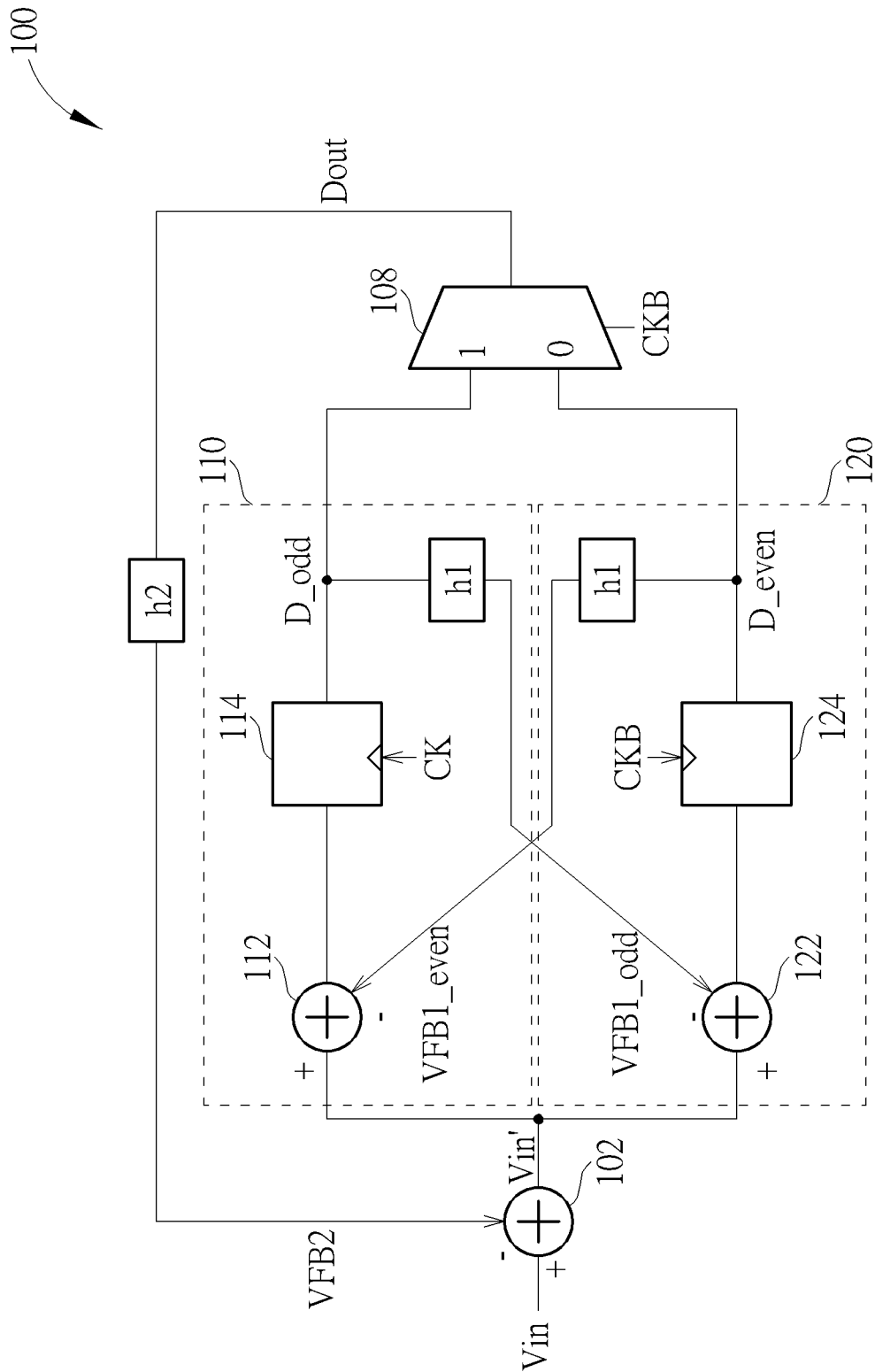
FIG. 1 is a diagram illustrating a decision feedback equalizer according to one embodiment of the present invention.

FIG. 1 is a diagram illustrating a decision feedback equalizer 100 according to one embodiment of the present invention. As shown in FIG. 1, the decision feedback equalizer 100 comprises a summer circuit 102, a first path 110, a second path 120 and a multiplexer 108, wherein the first path 110 comprises a summer circuit 112 and a sampling circuit 114, and the second path 120 comprises a summer circuit 122 and a sampling circuit 124.

Figure 2:
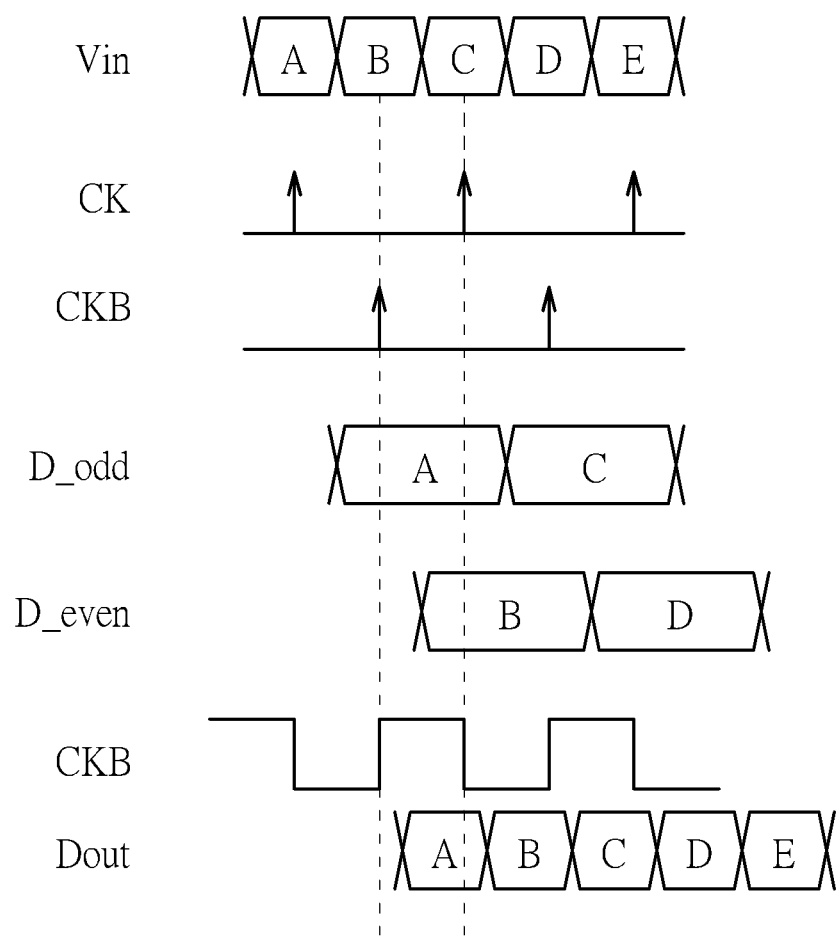
FIG. 2 is a timing diagram of a plurality signals within the decision feedback equalizer.

The decision feedback equalizer 100 shown in FIG. 1 adopts two paths and half-rate multiplex switching to achieve the purpose of reducing operation delay. Specifically, referring to the timing diagram shown in FIG. 2, in the operations of the decision feedback equalizer 100, the summer circuit 102 subtracts a feedback signal VFB2 from an input signal Vin to generate an adjusted input signal Vin'. Then, the summer circuit 112 within the first path subtracts a feedback signal VFB1_even from the adjusted input signal Vin', and the sampling circuit 114 uses a clock signal CK to sample an output signal of the summer circuit 112 to generate a first digital signal D_odd. The summer circuit 122 within the second path subtracts a feedback signal VFB1_odd from the adjusted input signal Vin', and the sampling circuit 124 uses a clock signal CKB to sample an output signal of the summer circuit 122 to generate a second digital signal D_even. Then, the multiplexer 108 uses the clock signal CKB to alternately output the first digital signal D_odd and the second digital signal D_even serving as a digital output signal Dout of the decision feedback equalizer 100. For example, assumed that the input signal Vin comprises A, B, C, D and E in sequence, and a frequency of the clock signals CK and CKB is half of a frequency of the input signal Vin, the first digital signal D_odd generated by the sampling circuit 114 comprises A, C and E, and the second digital signal D_even generated by the sampling circuit 124 comprises B and D. That is, the first digital signal D_odd is used as odd bits of the digital output signal Dout, and the second digital signal D_even is used as even bits of the digital output signal Dout.

In FIG. 1, the feedback signal VFB2 is generated by using a tap coefficient h2 to adjust the digital output signal Dout, the feedback signal VFB1_even is generated by using a tap coefficient h1 to adjust the second digital signal D_even, and the feedback signal VFB1_odd is generated by using the tap coefficient h1 to adjust the first digital signal D_odd. As described in the prior art, in the high-speed decision feedback equalizer, the most difficult part to achieve is the feedback of the first tap (that is, the operations of the feedback signal VFB1_even and the feedback signal VFB1_odd). Therefore, to reduce the feedback delay, the present invention embeds the feedback function into the sampling circuit, and the detailed implementations are described as follows.

Figure 3:
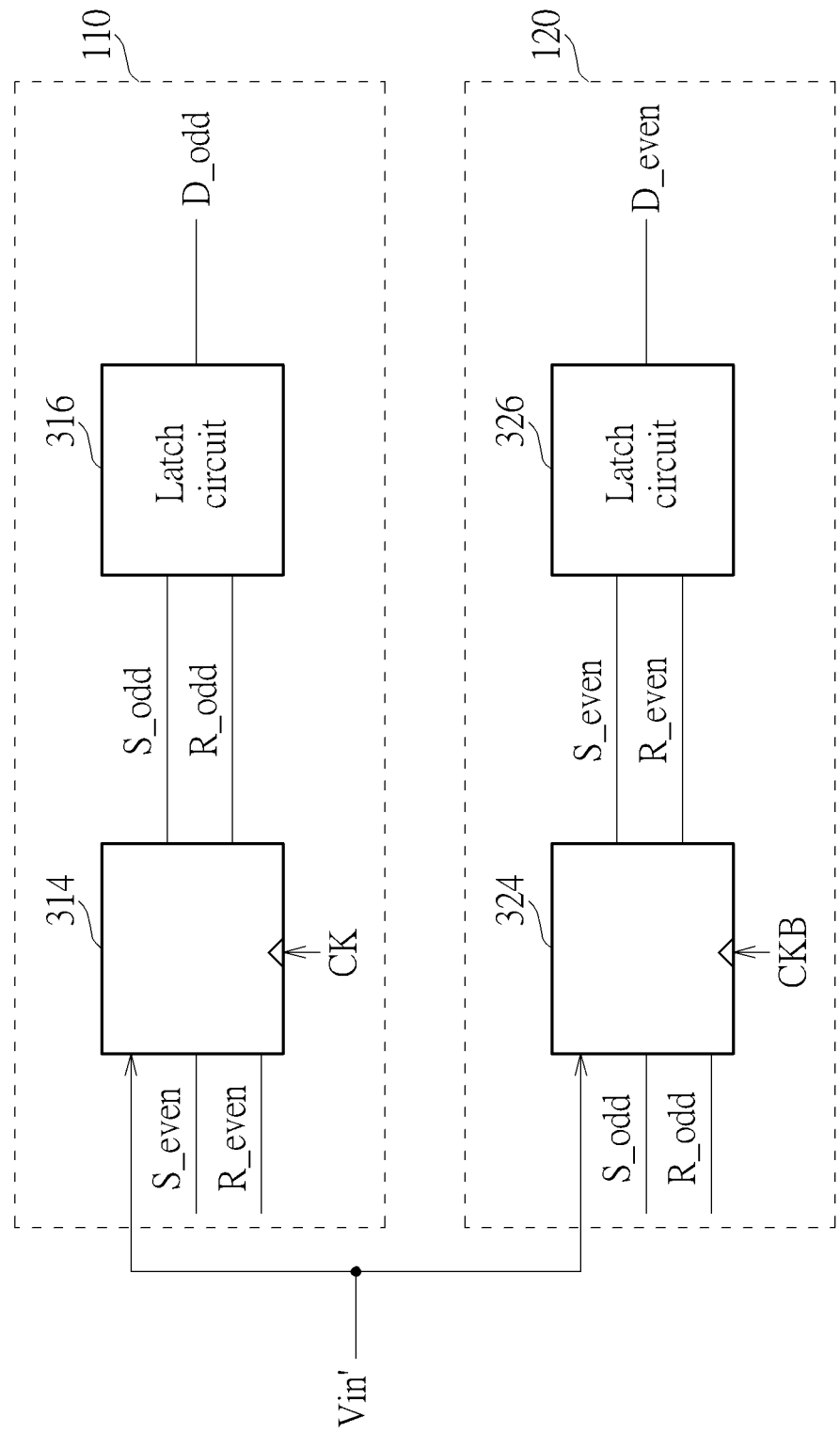
FIG. 3 is a circuit structure of a first path and a second path according to one embodiment of the present invention.

FIG. 3 is a circuit structure of the first path 110 and the second path 120 according to one embodiment of the present invention. As shown in FIG. 3, the first path comprises a sampling circuit 314 and a latch circuit (SR latch) 316, wherein the sampling circuit 314 has a built-in feedback function, that is the sampling circuit 314 comprises the summer circuit 112, the tap coefficient h1 and a portion of functions of the sampling circuit 114. Similarly, the second path comprises a sampling circuit 324 and a latch circuit (SR latch) 326, wherein the sampling circuit 324 has a built-in feedback function, that is the sampling circuit 324 comprises the summer circuit 122, the tap coefficient h1 and a portion of functions of the sampling circuit 124. In the embodiment shown in FIG. 3, the sampling circuit 314 generates a first set signal S_odd and a first reset signal R_odd according to the adjusted input signal Vin', a second set signal S_even and a second reset signal R_even, and the latch circuit 316 generates the first digital signal D_odd according to the first set signal S_odd and the first reset signal R_odd. Similarly, the sampling circuit 324 generates the second set signal S_even and the second reset signal R_even according to the adjusted input signal Vin', the first set signal S_odd and the first reset signal R_odd, and the latch circuit 326 generates the second digital signal D_even according to the second set signal S_even and the second reset signal R_even. In FIG. 3, the first set signal S_odd and the first reset signal R_odd correspond to the feedback signal VFB1_odd shown in FIG. 1, and the second set signal S_even and the second reset signal R_even correspond to the feedback signal VFB1_even shown in FIG. 1.

Figure 4:
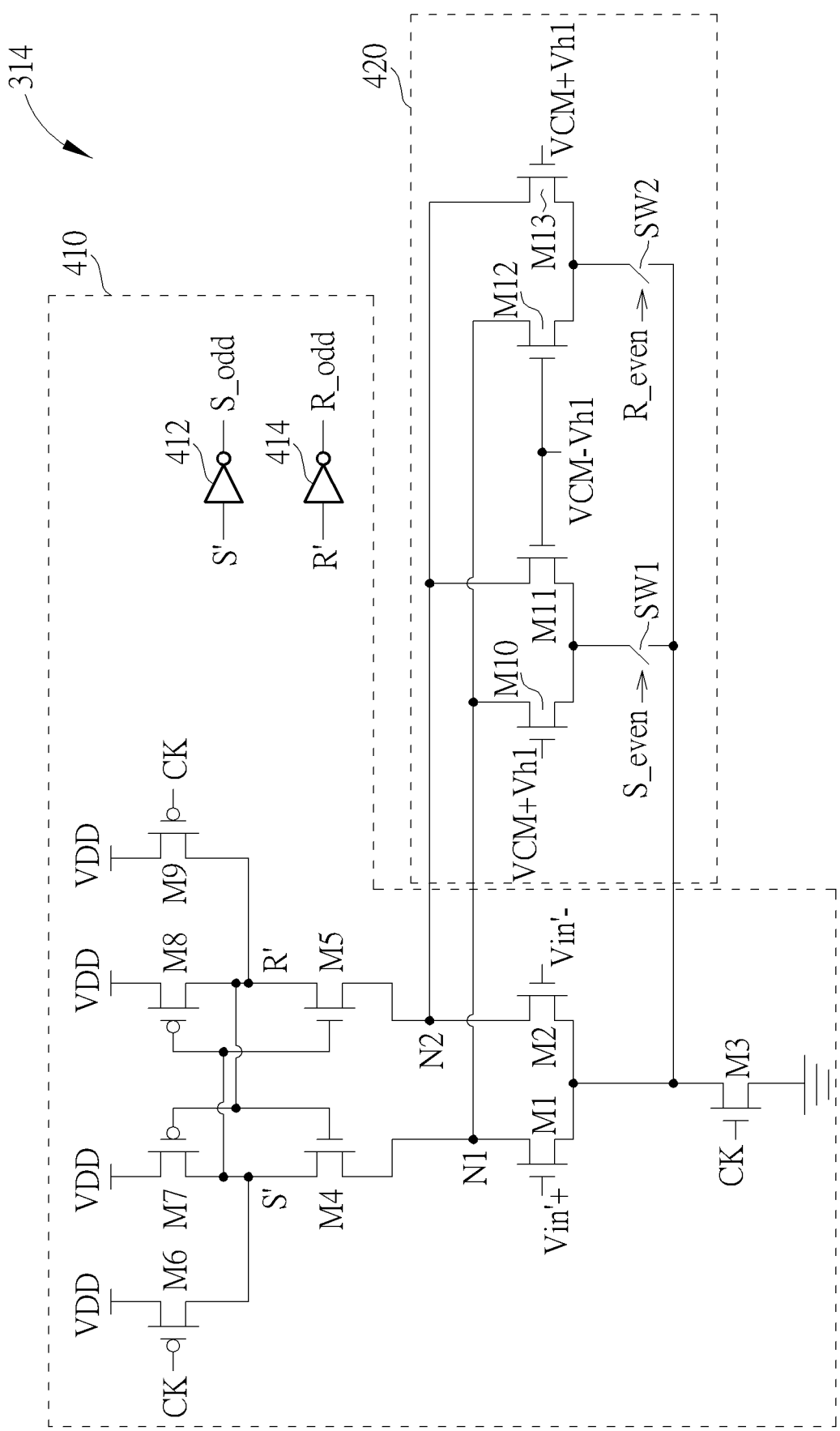
FIG. 4 is a diagram illustrating a sampling circuit according to a first embodiment of the present invention.

FIG. 4 is a diagram illustrating the sampling circuit 314 according to a first embodiment of the present invention. As shown in FIG. 4, the sampling circuit 314 comprises a sense amplifier 410 and an adjusting circuit 420, where the sense amplifier comprises transistors M1 and M2 for receiving the adjusted input signal Vin' comprising differential signals Vin'+ and Vin'−, a transistor M3 serving as a sense amplification switch, a plurality of transistors M4-M9 coupled to a supply voltage VDD, and two inverters 412 and 414. The adjusting circuit 420 comprises two transistors M10 and M11 serving as a first differential amplifier, two transistors M12 and M13 serving as a second differential amplifier, and two switches SW1 and SW2. In this embodiment, the transistors M1 and M2 receive the adjusted input signal Vin' to generate an amplified input signal at terminals N1 and N2, and drain electrodes of the transistors M4 and M5 are used to output signals S' and R', and the inverters 412 and 414 receive the signals S' and R' to generate the first set signal S_odd and the first reset signal R_odd, respectively. In addition, in the adjusting circuit 420, the first differential amplifier (i.e. the transistors M10 and M11) is connected to the transistor M3 serving as the sense amplification switch via the switch SW1, where the switch SW1 is controlled by the second set signal S_even, that is the first differential amplifier is selectively enabled according to the second set signal S_even to receive a differential signal (VCM+Vh1, VCM−Vh1) to generate a first adjusting signal to the terminals N1 and N2 to adjust a voltage level of the amplified input signal (i.e., add or subtract the voltage corresponding to the voltage Vh1 at the terminals N1 and N2). In addition, the second differential amplifier (i.e. the transistors M12 and M13) is connected to the transistor M3 serving as the sense amplification switch via the switch SW2, where the switch SW2 is controlled by the second reset signal R_even, that is the second differential amplifier is selectively enabled according to the second reset signal R_even to receive the differential signal (VCM+Vh1, VCM−Vh1) to generate a second adjusting signal to the terminals N1 and N2 to adjust the voltage level of the amplified input signal (i.e., add or subtract the voltage corresponding to the voltage Vh1 at the terminals N1 and N2).

The sampling circuit 324 is similar to the sampling circuit 314 shown in FIG. 4, the difference is that the output of the sampling circuit 410 needs to be changed from the first set signal S_odd and the first reset signal R_odd to the second set signal S_even and the second reset signal R_even, and the switches SW1 and SW2 are respectively controlled by the first set signal S_odd and the first reset signal R_odd. Since a person skilled in the art should understand how to implement the sampling circuit 324 after reading the above embodiments, further descriptions are omitted here.

Figure 5:
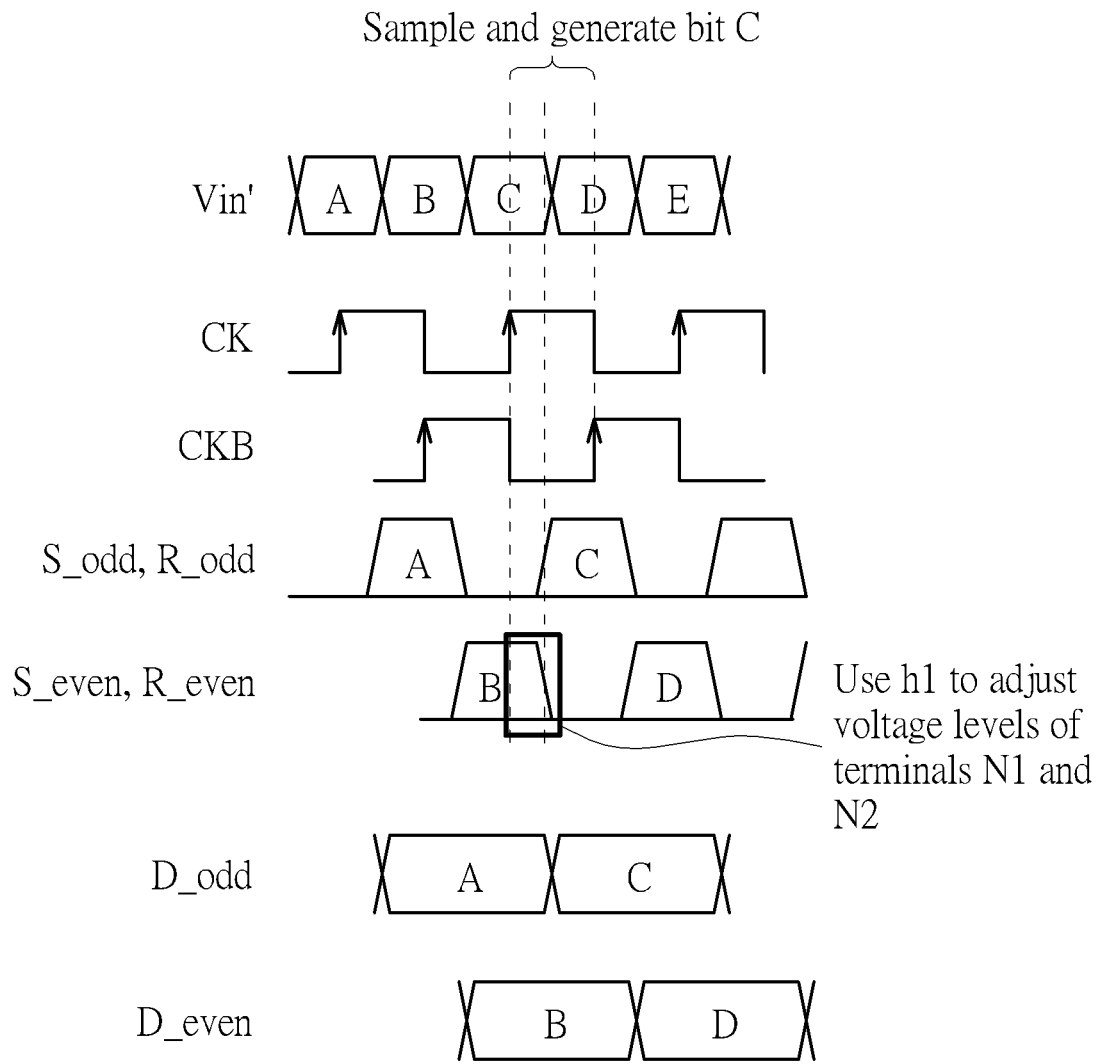
FIG. 5 is a timing diagram of a plurality of signals within the sampling circuit shown in FIG. 4.

As described in the circuit architectures of FIG. 3 and FIG. 4, the first set signal S_odd and the first reset signal R_odd generated by the sampling circuit 314 can be used by the sampling circuit 324 to quickly adjust the output signal of the sampling circuit 324, the second set signal S_even and the second reset signal R_even generated by the sampling circuit 324 can be used by the sampling circuit 314 to quickly adjust the output signal of the sampling circuit 314, and the overall circuit almost only has the amplification time of the sense amplifier 410 and the delay time of the inverters 412 and 414, so the embodiment can effectively reduce the feedback delay problem in the conventional architecture. Referring to the timing diagram shown in FIG. 5, after the sampling circuit 324 generates the second set signal S_even and the second reset signal R_even to determine the bit B, the second set signal S_even and the second reset signal R_even is quickly inputted into the adjusting circuit 420 of the sampling circuit 314 for the sampling circuit 314 to generate the first set signal S_odd and the first reset signal R_odd to determine the bit C.

In this embodiment, a common voltage VCM of the received differential signal of the first differential amplifier (i.e. the transistors M10 and M11) and the second differential amplifier (i.e. the transistors M12 and M13) of the adjusting circuit 420 is the same as a common voltage of the adjusted input signal Vin' (comprising the differential signal Vin'+ and Vin'−), so the sense amplifier 410 and the adjusting circuit 420 have the same/similar variation under different process, temperature and voltage, that is, the adjusting signal generated by the adjusting circuit 420 can actually reflect the voltage Vh1 without be influenced by the temperature. In addition, since the voltage Vh1 does not change with temperature, the adaptive algorithm of the tap coefficient h1 can be executed only when the electronic device is turned on without background execution, and the system complexity is indirectly reduced.

Figure 6:
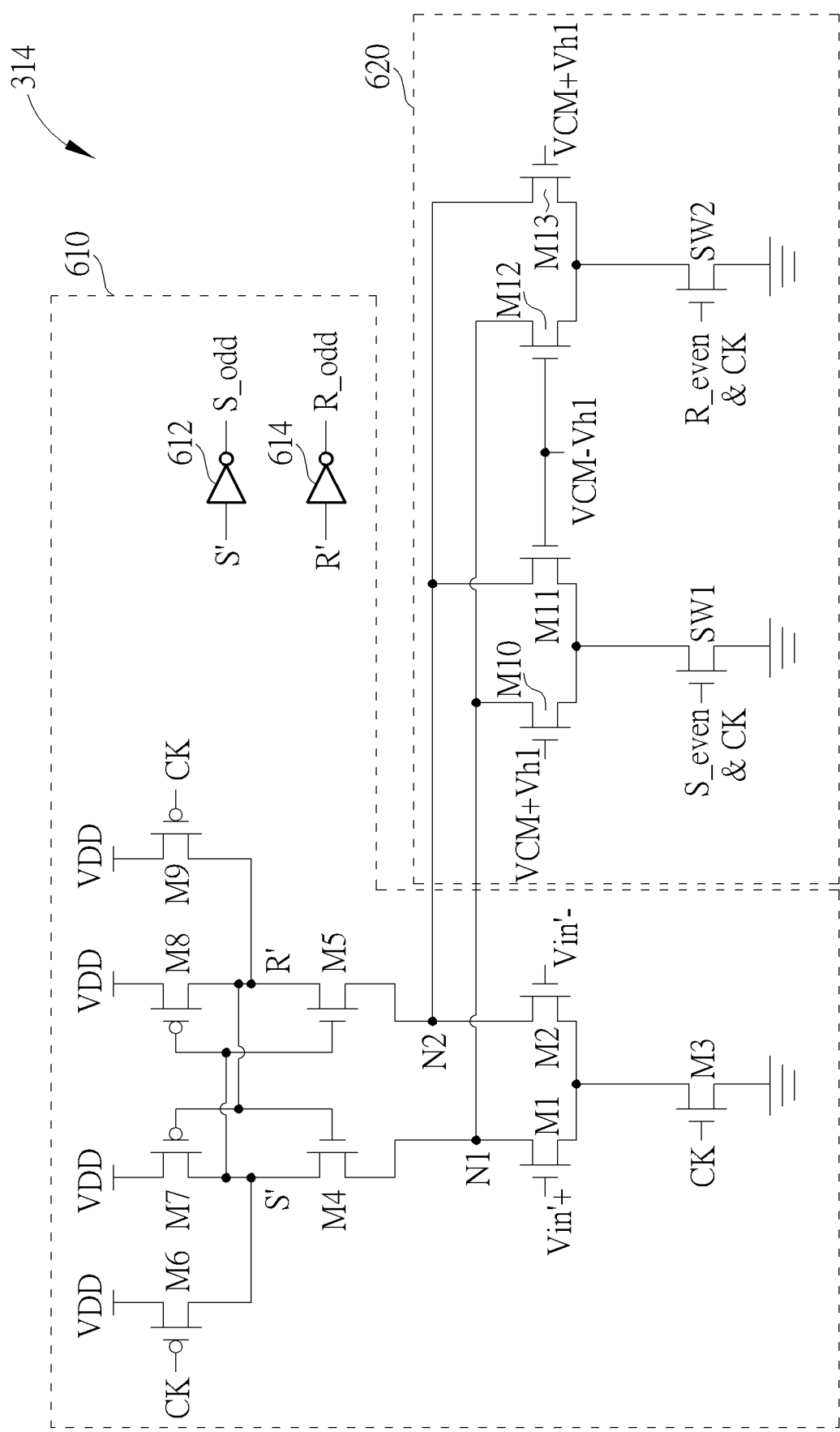
FIG. 6 is a diagram illustrating a sampling circuit according to a second embodiment of the present invention.

FIG. 6 is a diagram illustrating the sampling circuit 314 according to a second embodiment of the present invention. As shown in FIG. 6, the sampling circuit 314 comprises a sense amplifier 610 and an adjusting circuit 620, where the sense amplifier comprises transistors M1 and M2 for receiving the adjusted input signal Vin' comprising differential signals Vin'+ and Vin'−, a transistor M3 serving as a sense amplification switch, a plurality of transistors M4-M9 coupled to a supply voltage VDD, and two inverters 612 and 614. The adjusting circuit 620 comprises two transistors M10 and M11 serving as a first differential amplifier, two transistors M12 and M13 serving as a second differential amplifier, and two switches SW1 and SW2. In this embodiment, the transistors M1 and M2 receive the adjusted input signal Vin' to generate an amplified input signal at terminals N1 and N2, and drain electrodes of the transistors M4 and M5 are used to output signals S' and R', and the inverters 612 and 614 receive the signals S' and R' to generate the first set signal S_odd and the first reset signal R_odd, respectively. In addition, in the adjusting circuit 620, the first differential amplifier (i.e. the transistors M10 and M11) is connected to a ground voltage via the switch SW1, where the switch SW1 is controlled by the second set signal S_even and the clock signal CK (for example, controlled by an output signal of an AND gate receiving the second set signal S_even and the clock signal CK), that is the first differential amplifier is selectively enabled according to the second set signal S_even and the clock signal CK to receive a differential signal (VCM+Vh1, VCM−Vh1) to generate a first adjusting signal to the terminals N1 and N2 to adjust a voltage level of the amplified input signal (i.e., add or subtract the voltage corresponding to the voltage Vh1 at the terminals N1 and N2). In addition, the second differential amplifier (i.e. the transistors M12 and M13) is connected to the ground voltage via the switch SW2, where the switch SW2 is controlled by the second reset signal R_even and the clock signal CK (for example, controlled by an output signal of an AND gate receiving the second set signal S_even and the clock signal CK), that is the second differential amplifier is selectively enabled according to the second reset signal R_even and the clock signal CK to receive the differential signal (VCM+Vh1, VCM-Vh1) to generate a second adjusting signal to the terminals N1 and N2 to adjust the voltage level of the amplified input signal (i.e., add or subtract the voltage corresponding to the voltage Vh1 at the terminals N1 and N2).

The sampling circuit 324 is similar to the sampling circuit 314 shown in FIG. 6, the difference is that the output of the sampling circuit 610 needs to be changed from the first set signal S_odd and the first reset signal R_odd to the second set signal S_even and the second reset signal R_even, and the switches SW1 and SW2 are respectively controlled by the first set signal S_odd and the first reset signal R_odd with the clock signal. Since a person skilled in the art should understand how to implement the sampling circuit 324 after reading the above embodiments, further descriptions are omitted here.

Figure 7:
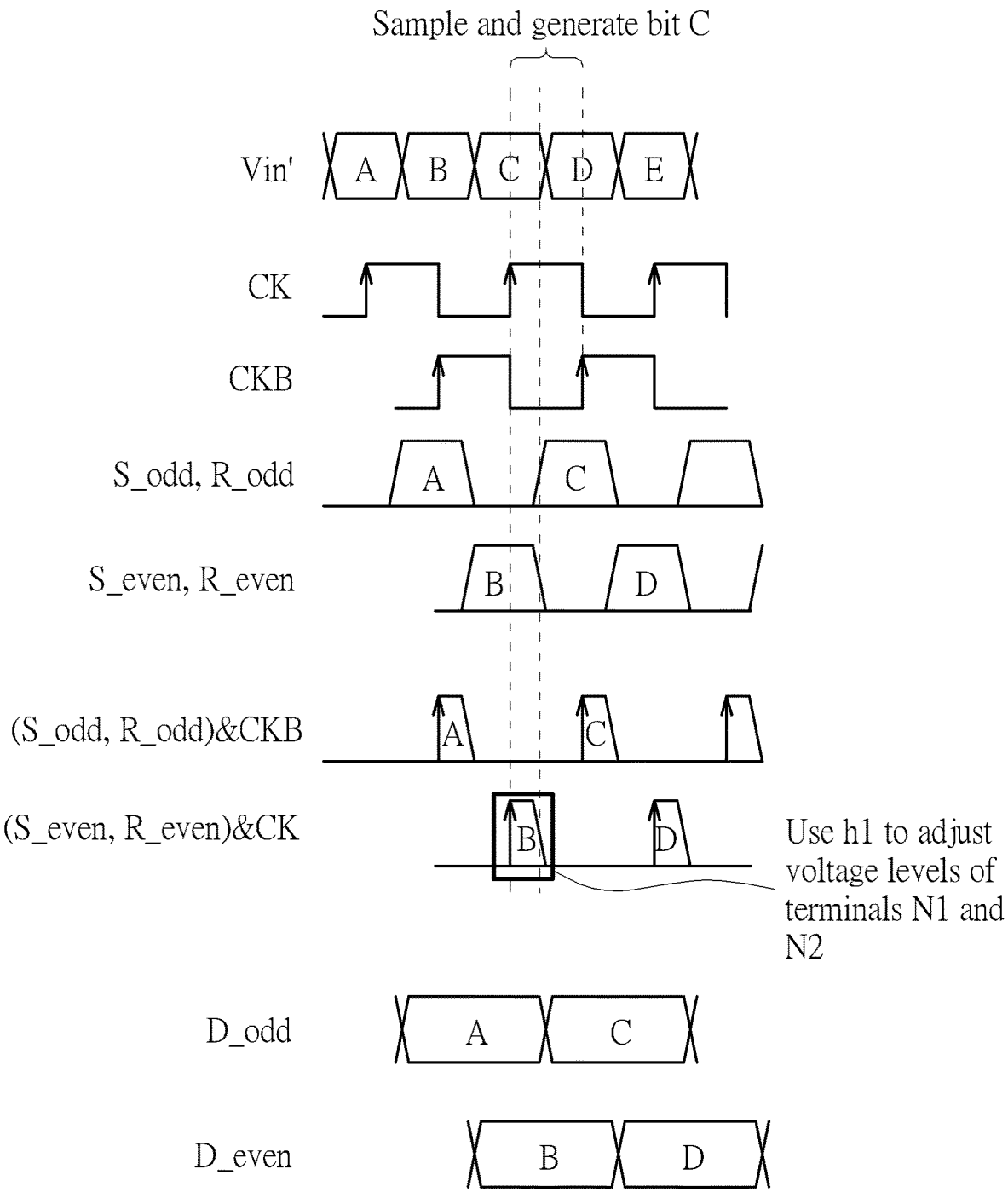
FIG. 7 is a timing diagram of a plurality of signals within the sampling circuit shown in FIG. 6.

As described in the circuit architectures of FIG. 3 and FIG. 6, the first set signal S_odd and the first reset signal R_odd generated by the sampling circuit 314 can be used by the sampling circuit 324 to quickly adjust the output signal of the sampling circuit 324, the second set signal S_even and the second reset signal R_even generated by the sampling circuit 324 can be used by the sampling circuit 314 to quickly adjust the output signal of the sampling circuit 314, and the overall circuit almost only has the amplification time of the sense amplifier 610 and the delay time of the inverters 612 and 614, so the embodiment can effectively reduce the feedback delay problem in the conventional architecture. Referring to the timing diagram shown in FIG. 7, after the sampling circuit 324 generates the second set signal S_even and the second reset signal R_even to determine the bit B, the second set signal S_even and the second reset signal R_even is quickly inputted into the adjusting circuit 620 of the sampling circuit 314 for the sampling circuit 314 to generate the first set signal S_odd and the first reset signal R_odd to determine the bit C.

In this embodiment, a common voltage VCM of the received differential signal of the first differential amplifier (i.e. the transistors M10 and M11) and the second differential amplifier (i.e. the transistors M12 and M13) of the adjusting circuit 620 is the same as a common voltage of the adjusted input signal Vin' (comprising the differential signal Vin'+ and Vin'−), so the sense amplifier 610 and the adjusting circuit 620 have the same/similar variation under different process, temperature and voltage, that is, the adjusting signal generated by the adjusting circuit 620 can actually reflect the voltage Vh1 without be influenced by the temperature. In addition, since the voltage Vh1 does not change with temperature, the adaptive algorithm of the tap coefficient h1 can be executed only when the electronic device is turned on without background execution, and the system complexity is indirectly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decision feedback equalizer, comprising:
   a first path, comprising:
      a first sampling circuit, for generating a first set signal and a first reset signal according to an input signal, a second set signal and a second reset signal; and
      a first latch circuit, coupled to the first sampling circuit, for generating a first digital signal according to the first set signal and the first reset signal;
   a second path, comprising:
      a second sampling circuit, for generating the second set signal and the second reset signal according to the input signal, the first set signal and the first reset signal; and
      a second latch circuit, coupled to the second sampling circuit, for generating a second digital signal according to the second set signal and the second reset signal;
   wherein the first sampling circuit comprises:
      a sense amplifier, for receiving the input signal to generate an amplified input signal at a terminal; and
      an adjusting circuit, coupled to the terminal of the sense amplifier, for referring to the second set signal and the second reset signal to generate an adjusting signal to the terminal to adjust a voltage level of the amplified input signal;
   wherein the first set signal and the first reset signal is generated according to the amplified input signal.

2. The decision feedback equalizer of claim 1, wherein the first digital signal serves as odd bits of a digital output signal of the decision feedback equalizer, and the second digital signal serves as even bits of the digital output signal of the decision feedback equalizer.

3. The decision feedback equalizer of claim 1, wherein the adjusting circuit comprises:
   a first differential amplifier, wherein the first differential amplifier is selectively enabled according to the second set signal to refer to a first differential signal to generate a first adjusting signal to the terminal to adjust the voltage level of the amplified input signal; and
   a second differential amplifier, wherein the second differential amplifier is selectively enabled according to the second reset signal to refer to a second differential signal to generate a second adjusting signal to the terminal to adjust the voltage level of the amplified input signal.

4. The decision feedback equalizer of claim 3, wherein the input signal is a differential input signal, and the differential input signal, the first differential signal and the second differential signal have a same common voltage.

5. The decision feedback equalizer of claim 3, wherein the sense amplifier comprises a sense amplification switch, the sense amplification switch is enabled or disabled according to a clock signal, source electrodes of transistors within the first differential amplifier are coupled to the sense amplification switch via a switch, and source electrodes of transistors within the second differential amplifier are coupled to the sense amplification switch via second switch; and the first switch and the second switch are controlled by the second set signal and the second reset signal, respectively.

6. The decision feedback equalizer of claim 5, wherein drain electrodes of the transistors within the first differential amplifier are directly connected to the terminal of the sense amplifier, and drain electrodes of the transistors within the second differential amplifier are directly connected to the terminal of the sense amplifier.

7. The decision feedback equalizer of claim 1, wherein the adjusting circuit comprises:
a first differential amplifier, wherein the first differential amplifier is selectively enabled according to the second set signal and a clock signal to refer to a first differential signal to generate a first adjusting signal to the terminal to adjust the voltage level of the amplified input signal; and
a second differential amplifier, wherein the second differential amplifier is selectively enabled according to the second reset signal and the clock signal to refer to a second differential signal to generate a second adjusting signal to the terminal to adjust the voltage level of the amplified input signal.

8. The decision feedback equalizer of claim 7, wherein the input signal is a differential input signal, and the differential input signal, the first differential signal and the second differential signal have a same common voltage.

9. The decision feedback equalizer of claim 7, wherein the sense amplifier comprises a sense amplification switch, the sense amplification switch is enabled or disabled according to a clock signal, source electrodes of transistors within the first differential amplifier are coupled to a reference voltage via a switch, and source electrodes of transistors within the second differential amplifier are coupled to the reference voltage via second switch; and the first switch is controlled by the second set signal and the clock signal simultaneously, and the second switch is controlled by the second reset signal and the clock signal simultaneously.

10. The decision feedback equalizer of claim 9, wherein drain electrodes of the transistors within the first differential amplifier are directly connected to the terminal of the sense amplifier, and drain electrodes of the transistors within the second differential amplifier are directly connected to the terminal of the sense amplifier.

* * * * *